(12) United States Patent
Lichter

(10) Patent No.: US 6,310,361 B1
(45) Date of Patent: Oct. 30, 2001

(54) ELECTRICAL TEST STRUCTURE ON A SEMICONDUCTOR SUBSTRATE AND TEST METHOD

(75) Inventor: Gerd Lichter, Radeburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/504,275

(22) Filed: Feb. 15, 2000

(30) Foreign Application Priority Data

Feb. 15, 1999 (DE) .............................. 199 06 292

(51) Int. Cl.$^7$ .............................. H01L 23/58; H01L 21/66
(52) U.S. Cl. .................................. 257/48; 438/18
(58) Field of Search .................... 257/48; 438/5, 438/6, 10, 11, 14, 17, 18

(56) References Cited

U.S. PATENT DOCUMENTS 5,185,294 * 2/1993 Lam et al. .
5,731,218 * 3/1998 Melzner et al. .
6,080,661 * 6/2000 Bothra .
6,087,189 * 7/2000 Huang .

FOREIGN PATENT DOCUMENTS 0 543 158 A1   5/1993   (EP) .
0 651 433 A1   5/1995   (EP) .

* cited by examiner

*Primary Examiner*—Charles Bowers
*Assistant Examiner*—Evan Pert
(74) *Attorney, Agent, or Firm*—Herbert L. Lerner; Laurence A. Greenberg; Werner H. Stemer

(57) ABSTRACT

The test structure has a row of transistors with at least two transistors. The S/D regions of the transistors are connected in series and the first and the last S/D region in the row can be connected. Possible etching of the gate polysilicon can be ascertained by measuring the resistance between the terminals given a suitable gate potential. The invention enables, in particular, in situ monitoring of a KOH attack on the n-doped gate polysilicon in a DRAM memory cell.

11 Claims, 4 Drawing Sheets

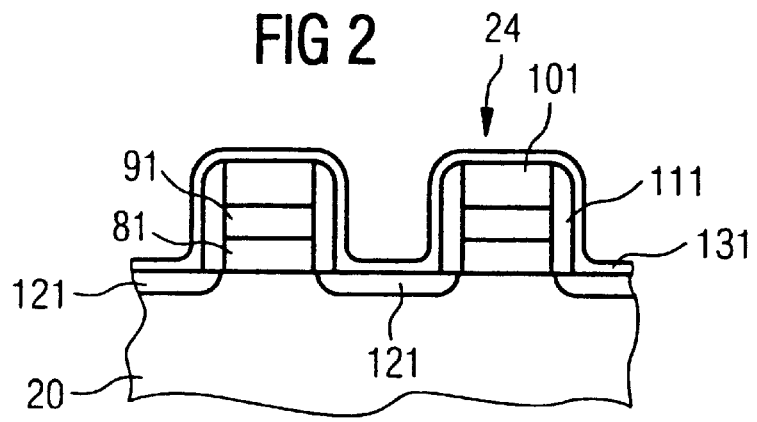
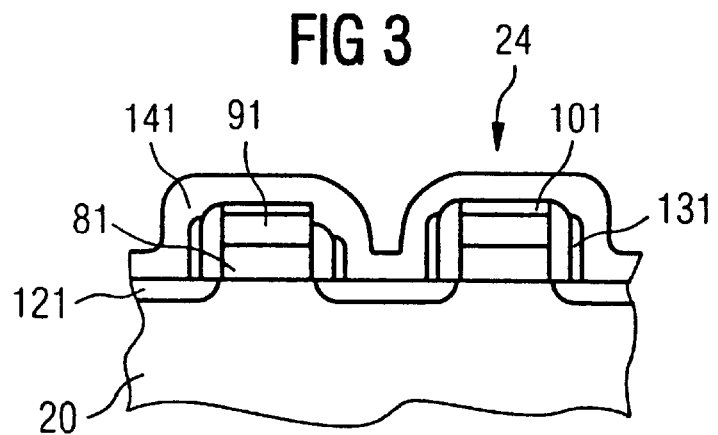
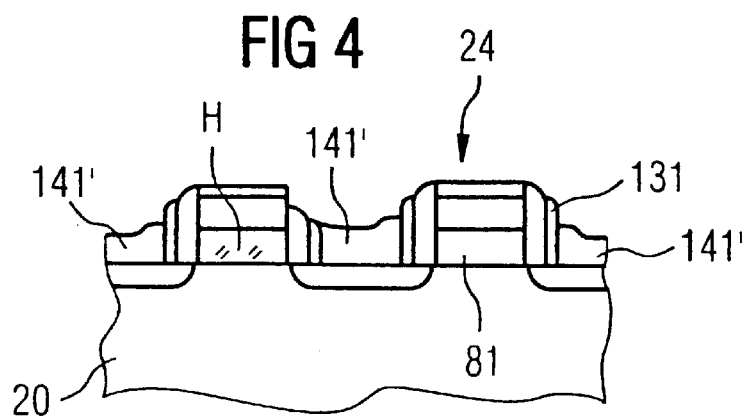

ELECTRICAL TEST STRUCTURE ON A SEMICONDUCTOR SUBSTRATE AND TEST METHOD

BACKGROUND OF THE INVENTION

Field of Invention

The invention relates to an electrical test structure in an integrated circuit, in particular in a DRAM circuit with trench capacitors. The invention further relates to a test method.

A multiplicity of process steps are necessary for fabricating an integrated circuit on a semiconductor substrate. A number of process steps during which a specific (partial) structure of the circuit is produced is referred to as a module; examples thereof are modules for forming isolation trenches in the substrate, for forming a transistor or for forming a capacitor. In order to identify defect sources, it is necessary to check individual process steps or complete modules in a suitable manner to ascertain whether prescribed specifications are being adhered to. It is thereby possible to use so-called "monitor wafers" (additional wafers on which the complete circuit is not fabricated) or the wafers with the partly completed circuits themselves. Optical or electrical test methods, inter alia, can be employed, the circuit itself or dedicated test structures being evaluated.

The present invention relates to a test method and a test structure which can be used, in particular, in the fabrication of DRAM memories with trench capacitors and a polysilicon strip (surface strap) as an electrical connection between the selection transistor and the capacitor, and will be explained in more detail using this example. The essential steps of the fabrication method or of the process module that is relevant in this case for the type of memory cells mentioned are illustrated in FIGS. 5 to 8. Provision is made (see FIG. 5) for forming, in a semiconductor substrate 1, a trench 2 for a capacitor, whose wall is provided with a capacitor dielectric 3 in the lower section and with a thicker insulation collar 4 in the upper section. The trench is filled with doped polysilicon 5a, 5b as storage electrode. An isolation trench 6 is formed, which partly overlaps the trench and is filled with TEOS, for example. The isolation trench serves, in particular, to effect insulation from a neighboring cell which adjoins the memory cell illustrated in FIG. 5 in a mirror-inverted manner on the right-hand side. The selection transistor is then formed adjacent to the capacitor trench 2. A so-called gate stack comprising, in particular, n-doped polysilicon 8, a further conductive layer 9 (for example WSi or another silicide) arranged thereon and a covering insulation layer 10 (for example made of silicon oxide or nitride) is formed on a gate oxide 7. An insulating spacer 11 preferably made of the material of the covering insulation layer is produced on the sidewalls of the gate stack and the S/D regions 12 of the transistor are implanted. If appropriate, the spacer may be designed in two parts, LDD regions being implanted after the first spacer element in a known manner. The selection transistor of the memory cell is thus completed. A silicon nitride layer 13 is subsequently applied. The layer 13 has a preferred thickness in the range of from 20 to 30 nm.

The method further provides (see FIG. 6) for the nitride layer 13 to be removed, with the aid of a photomask, at the locations at which the surface straps for electrical connection between the selection transistor and the capacitor are intended to be formed. At the same time, the upper region of the trench capacitor is etched into and, in particular, the thick insulation collar is removed at that location down to a predetermined depth, thereby enabling contact with the capacitor here as well. The photomask thus has an opening above a region of the capacitor filling and the adjacent S/D region. The etching process employed (for example using $CHF_3/CF_4$ and oxygen and argon) also attacks the covering insulating layer 10 and the side wall spacer 11 of the gate stack, so that there is a risk that the doped polysilicon 8 of the word line is uncovered. After the removal of the photomask, implantation using $BF_2$ ions, in particular, is performed; the remaining nitride 13 acts as a doping mask in this case. The opening in the nitride layer 13 corresponds to the opening in the photomask. It is essentially the case that uncovered silicon is p-doped—that is to say the region of the capacitor filing and the adjacent S/D region—while hardly any $B^+$ ions are deposited in uncovered silicon oxide. Afterwards, undoped polysilicon 14 is applied and p-doped section by section by means of outdiffusion from the underlying doped silicon and polysilicon. The polysilicon 14 thereby fills the hole produced in the trench. Its preferred thickness is from 50 to 100 nm.

The undoped polysilicon 14 is removed (see FIG. 7) by a KOH etching process or another suitable selective etching process which does not attack the $p^+$-doped polysilicon sections 14' thus produced. The doped $p^+$-type polysilicon sections 14' form the "surface straps". There is a risk, however, of possibly uncovered n-doped polysilicon 8 of the gate likewise being attacked and removed. $P^-$-doped silicon as a gate constituent would also be attacked by the etchant. This leads to the failure of the selection transistor (and hence of the memory cell) since a cavity is then produced above the gate oxide and the transistor cannot be driven, i.e., switched. It has been shown that the failing cells are usually distributed statistically and there exist correlations not just with one preceding process step, but with a number of preceding process steps.

The failure mechanism described leads to a dip in the yield. Electrical inline monitoring during the production process has not been possible heretofore, in particular as the problem generally occurs only in the cell array. There is an equally small possibility of unambiguously assigning the KOH attack to (subsequent) test data.

Further details of the method, only the essential points of which have been described here, are disclosed for example in U.S. Pat. No. 5,185,294 (European application EP 543 158 A2) and U.S. Pat. No. 5,731,218 (European application EP 651 433 A1—in particular columns 4 and 6 of the description).

SUMMARY OF THE INVENTION

It is accordingly an object of the invention to provide a test method and a test structure, which overcomes the above-mentioned disadvantages of the heretofore-known devices and methods of this general type and which enable real-time or inline monitoring, that is to say monitoring which accompanies the process.

With the foregoing and other objects in view there is provided, in accordance with the invention, a semiconductor structure, comprising:

a semiconductor substrate;

at least two MOS transistors formed in the semiconductor substrate;

each of the transistors having a gate with an n-doped or $p^-$-doped polysilicon layer and a conductive layer disposed above the polysilicon layer, a first S/D region and a second S/D region, the gate having a covering insulation layer and insulating sidewall spacers;

the gates of the transistors being electrically connected to one another and having a terminal;

the second S/D region of a first one of the transistors being electrically connected to the first S/D region of a second one of the transistors; and the first S/D region of the first transistor being connected to a first terminal and the second S/D region of the second transistor is connected to a second terminal.

In accordance with an added feature of the invention, the active regions of the transistors form a contiguous strip of monocrystalline silicon in the semiconductor substrate, and the first terminal and the second terminal are arranged near edges at opposite ends of the strip.

In accordance with an additional feature of the invention, a continuous, meandering word line runs over the strip, the word line containing the gates of the transistors.

In accordance with another feature of the invention, the conductive layer is composed of a silicide, preferably WSi.

With the above and other objects in view there is also provided, in accordance with the invention, a method for detecting an etching attack on a polysilicon interconnect using an electrical test method. The test method comprises the following steps:

forming a semiconductor structure as outlined above as a test structure;

applying a photomask with an opening uncovering in each case at least one insulating spacer on a side of each transistor, etching through the opening, and removing the photomask;

selectively wet etching to attack the polysilicon;

applying a potential to the gates of the transistors; and measuring a resistance between the first terminal and the second terminal.

In an alternative of the invention, there is also provided a method with the following steps:

forming a semiconductor structure as outlined above as a test structure;

applying a nitride layer;

applying a photomask with an opening uncovering in each case at least one insulating spacer on a side of each transistor, etching the nitride layer through the opening, and removing the photomask;

implanting a p-type dopant;

applying an undoped polysilicon layer and doping the layer section by section by outdiffusion from the support;

removing undoped sections of the polysilicon layer by selective wet etching;

applying a potential corresponding to an on state of the transistors to the gates of the transistors; and measuring a resistance between the first terminal and the second terminal.

In accordance with a further feature of the invention, a selection transistor of a memory cell in a DRAM circuit is fabricated concurrently with the transistors of the test structure.

In accordance with a concomitant feature of the invention, a p-doped polysilicon connecting strip for electrically connecting the selection transistor to an electrode of a storage capacitor of the memory cell is formed concurrently with the p-doped polysilicon sections.

The test structure has at least two transistors with series-connected S/D regions, which are fabricated in the same way as the selection transistor. They thus have a gate stack with ndoped or p-doped polysilicon and at least one insulating sidewall spacer. The first and the last S/D region of the row of transistors can be connected externally via a first and second terminal, respectively. The gates can likewise be connected. The test method provides for this test structure to be processed further in accordance with the module for producing the surface strip as explained in the introduction. Therefore, the explained nitride layer is applied and patterned using the photomask. The openings in the photomask extend, in the region of the test structure, at least over those regions of the transistors in the case of which openings are also present in the cell array in the case of the corresponding transistors. The openings in the region of the test structure are preferably larger, however, thereby creating as it were "worst-case" conditions for the transistor, namely a more prolonged etching attack. The method is continued in the manner described in the introduction and a surface strap is formed. A potential corresponding to an open state of the transistors is then applied to the gates of the "normally off" transistors. The current flowing between the first and second terminals of the test structure is measured. If, given a gate potential which corresponds to an open state of the transistors, no current flows through the row of transistors or the resistance rises sharply, in other words if at least one transistor in the row cannot be switched, this allows the conclusion of a KOH attack to be drawn. If the resistance is within the specification, a KOH attack is ruled out. The typical value for an "off current" of a transistor (for example in a memory cell) is $10^{-6}$–$10^{-5}$ pA. The "on current" lies in the range of 10–100 $\mu$A. In the case of a KOH attack, the current under "on conditions" is therefore several orders of magnitude lower than in the case of a defect-free process.

By using the test structure and the test method, possible dips in yield can be identified in a manner that accompanies the process, thereby resulting in a considerable gain in time. It is possible to ascertain correlations with process parameters and, if appropriate, eliminate defect sources.

The test structure requires only a small amount of space. By way of example, the active regions of the transistors can be arranged linearly, that is to say constitute a continuous strip of crystalline silicon which is doped in predetermined regions in order to form the S/D regions and may possibly be additionally siliconized (with TiSi or the like). The gates of the transistors each run transversely with respect to said strips; a continuous word line is preferably laid in a meandering fashion (in a zigzag fashion in the widest sense) over the active region, which word line crosses the active region in a manner corresponding to the number of transistors to be formed. The crystalline silicon is surrounded by an insulation region (for example shallow trench isolation). The crystalline silicon strip is provided with the first terminal at one end and with the second terminal at the other end.

The preferred specification of transistors in the row is dependent on the given boundary conditions, in particular the available space. By way of example, 4–5 transistors are expedient for obtaining a reliable test result. More transistors are also conceivable.

Other features which are considered as characteristic for the invention are set forth in the appended claims.

Although the invention is illustrated and described herein as embodied in an electrical test structure on a semiconductor substrate and test method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2–4 are partial cross sections through two adjacent transistors of the test structure which is used to explain the test method;

DESCRIPTION OF THE PREFERRED EMBODIMENTS

Figure 1:
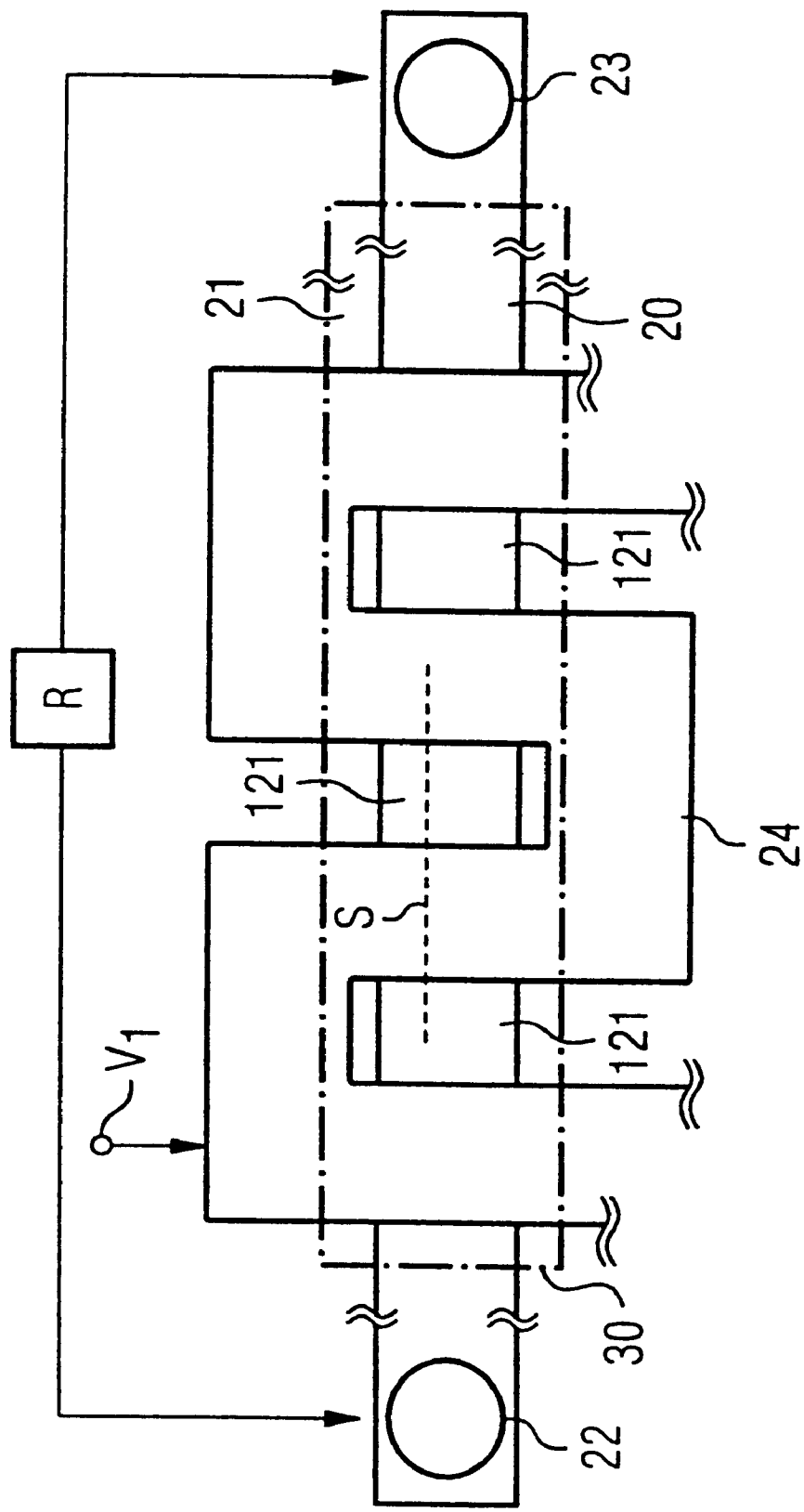
FIG. 1 shows a plan view of a test structure according to the invention.
Figure 5:
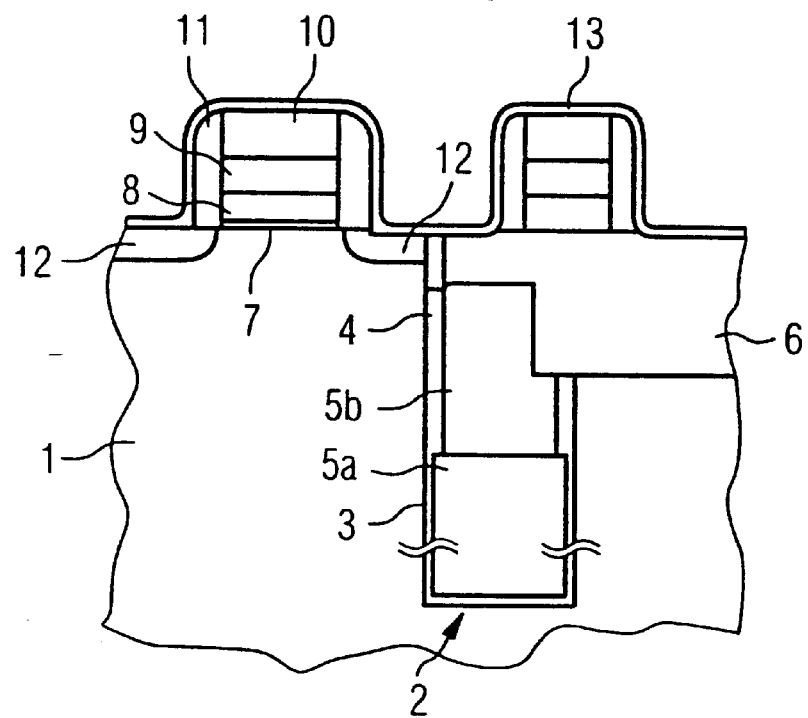
FIGS. 5–7 show a cross section through a DRAM memory cell which is used to explain the process module to be investigated.
Figure 6:
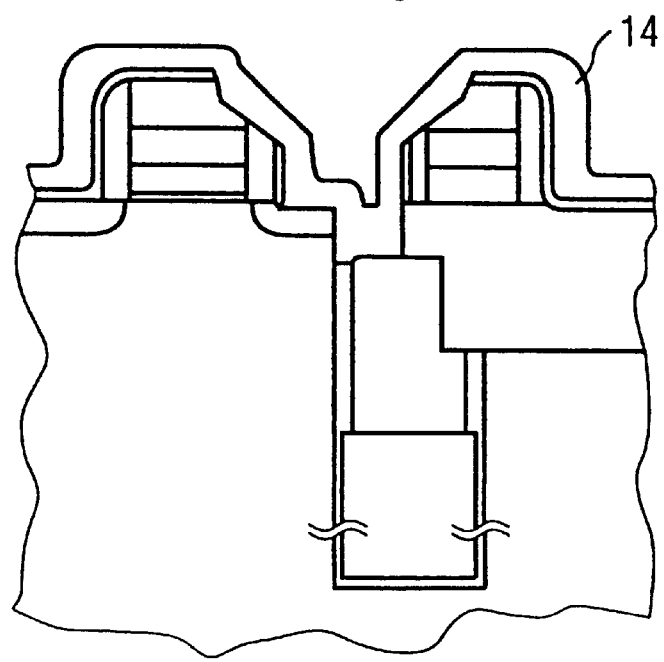
Figure 7:
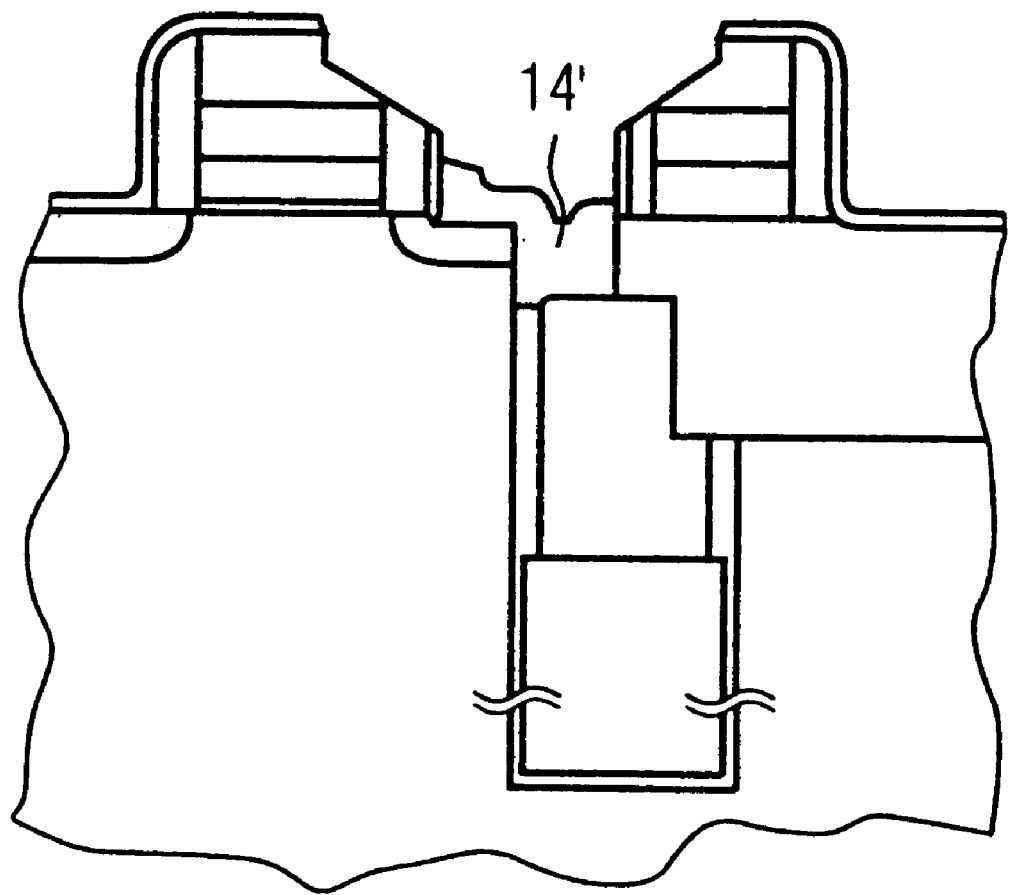

Referring now to the figures of the drawing in detail and first, particularly, to FIG. 1 thereof, there is shown a simple and space-saving structure is formed by a strip of crystalline silicon 20 as the active region of the transistors and a word line 24 running above this in a meandering fashion. The course of the word line 24 corresponds to a square-wave function. The plan view shows a crystalline region 20 in the form of a strip as the active region, which is surrounded by an insulation region 21 at the substrate surface. The silicon region 20 has a first terminal 22 and a second terminal 23. Between these terminals, the silicon region is crossed a number of times by a continuous word line 24. In this case, each of the crossover points between the word line and the active region represents a gate with an underlying channel region of a transistor. As illustrated in FIGS. 2 to 4, this word line is constructed as a gate stack and provided with an insulating covering and insulating spacers; the S/D (source-drain) regions 121 are then fabricated in the silicon strip 20 by implantation. The series-connected transistors of the test structure are formed in this way.

FIG. 2 shows a section through a detail of the test structure taken along the dotted line S in FIG. 1. The transistors are fabricated in the same way and at the same time as the selection transistors in the cell array. The word line thus comprises n-doped polysilicon 81, a silicide 91 (in particular WSi) of the insulating gate covering 101 and lateral insulating spacers 111. The gate oxide underneath the n-doped silicon has not been illustrated here. The S/D regions 121 are implanted at the same time as the implantation of the selection transistors. The test structure thus produced is subjected to the process module that has been explained. Thus, a nitride layer 131 is deposited over the whole area and a photomask is applied. The photomask has an opening within the dash-dotted region 30 shown in FIG. 1. The section line S lies completely within this region 30, so that the mask is removed here and cannot be discerned in FIG. 2. As already explained, the opening 30 may also be smaller; it only has to uncover, in the case of each transistor of the test structure, at least the corresponding region as in the case of a transistor in the cell array, that is to say overlap at least one edge of the gate and part of the S/D region. A possible KOH attack is reliably detected by virtue of the very much larger opening 30 in this exemplary embodiment. Furthermore, the mask opening 30 extends continuously over all of the transistors, as illustrated in FIG. 1.

With reference to FIG. 3, the above-explained etching process for removing the nitride layer 131—and for laterally uncovering the S/D region in the cell array—is performed next. The silicon substrate is not attacked in the process. In the test structure, the gate covering is thinned in the process.

The above-explained p-type implantation is performed and an undoped polysilicon layer 141 is applied. The thermal treatment step for outdiffusion is performed, with the result that the undoped polysilicon layer 141 is p-doped section by section and sections 141' are formed. Within the detail illustrated in FIGS. 2 to 4, the nitride layer serving as a diffusion barrier is removed except for possible spacers (caused by the anisotropy of the etching process). The subsequent implantation does not, however, deposit the p-dopant uniformly over the entire surface but rather in dependence on underlying material. Therefore, a continuous p-doped polysilicon layer 141' is not formed in the course of the outdiffusion process.

With reference to FIG. 4, by means of a KOH-containing etching solution, the undoped polysilicon 141 is removed selectively with respect to the sections 141' that have been doped by outdiffusion. If the n-type polysilicon 81 is no longer sufficiently insulated due to previous processes, it can be dissolved out, as indicated in the left-hand transistor in FIG. 4. A cavity H is formed here. This transistor can no longer be switched via the gate potential.

An electrical test method is subsequently performed. A potential $V_1$ corresponding to an on state of the transistors is applied to the word line 24, and the resistance present between the first terminal 22 and the second terminal 23 is determined. If the resistance corresponds to the specifications of the row of transistors, a KOH attack in the test structure is ruled out. Since the test structure was exposed to "worst case" conditions, a KOH attack in the cell array can be ruled out with a high degree of certainty.

It is evident that the principle behind the test method and the test structure can also be used to detect quite generally a desired or undesired undercut (removal of the polysilicon). In the case of "normally off" transistors, an undercut, in the case of at least one of the transistors, then has the effect of a resistance that continues to be high when a potential (corresponding to "on") is applied to the gates. In the case of "normally on" transistors, an undercut, in the case of all of the transistors, has the effect of a resistance that continues to be low even when an "off" potential is applied to the gates. In this general application of the invention, the steps tailored to the fabrication of memory cells (in particular the nitride layer, the undoped polysilicon layer, outdiffusion and/or implantation) are not necessary. If the production of the cavity H is desired, suitable access to the lower polysilicon layer is produced through the opening (30) in the photomask by means of the etching process.

I claim:

1. A semiconductor test structure for in situ determination of an etching attack on polysilicon, comprising:

a semiconductor substrate;

a plurality of MOS transistors formed in said semiconductor substrate;

each of said transistors having a gate with a doped polysilicon layer for evaluating said etching attack and a conductive layer disposed above said polysilicon layer, a first S/D region and a second S/D region, said gate having a covering insulation layer and insulating sidewall spacers;

said gates of said transistors being electrically connected to one another and having a terminal;

said second S/D region of a first one of said transistors being electrically connected to said first S/D region of a second one of said transistors; and said first S/D region of said first transistor being connected to a first terminal and said second S/D region of the second transistor is connected to a second terminal.

2. The semiconductor structure according to claim 1, wherein said polysilicon layer is n-doped.

3. The semiconductor structure according to claim 1, wherein said polysilicon layer is p⁻-doped.

4. The semiconductor structure according to claim 1, wherein active regions of said transistors form a contiguous strip of monocrystalline silicon in said semiconductor substrate, and said first terminal and said second terminal are arranged near edges at opposite ends of said strip.

5. The semiconductor structure according to claim 4, which comprises a continuous, meandering word line running over said strip, said word line containing said gates of said transistors.

6. The semiconductor structure according to claim 1, wherein said conductive layer is composed of a silicide.

7. The semiconductor structure according to claim 1, wherein said silicide is WSi.

8. A method for detecting an etching attack on a polysilicon interconnect using an electrical test method, which comprises the following steps:

forming a semiconductor test structure according to claim 1;

applying a photomask with an opening uncovering in each case at least one insulating spacer on a side of each transistor, etching through the opening, and removing the photomask;

selectively wet etching to attack the polysilicon;

applying a potential to the gates of the transistors; and measuring a resistance between the first terminal and the second terminal.

9. A method for detecting an etching attack on a polysilicon interconnect using an electrical test method, which comprises the following steps:

forming a semiconductor test structure according to claim 1;

applying a nitride layer;

applying a photomask with an opening uncovering in each case at least one insulating spacer on a side of each transistor, etching the nitride layer through the opening, and removing the photomask;

implanting a p-type dopant;

applying an undoped polysilicon layer and doping the layer section by section by outdiffusion from the support;

removing undoped sections of the polysilicon layer by selective wet etching;

applying a potential corresponding to an on state of the transistors to the gates of the transistors; and measuring a resistance between the first terminal and the second terminal.

10. The method according to claim 9, which comprises fabricating a selection transistor of a memory cell in a DRAM circuit concurrently with the transistors of the test structure.

11. The method according to claim 9, which comprises forming a p-doped polysilicon connecting strip for electrically connecting the selection transistor to an electrode of a storage capacitor of the memory cell concurrently with the p-doped polysilicon sections.

* * * * *